(12) United States Patent
Levinson et al.

(10) Patent No.: US 6,984,475 B1
(45) Date of Patent: Jan. 10, 2006

(54) EXTREME ULTRAVIOLET (EUV) LITHOGRAPHY MASKS

(75) Inventors: Harry J. Levinson, Saratoga, CA (US); Bruno M. LaFontaine, Pleasanton, CA (US); Ivan Lalovic, Mountain View, CA (US); Adam R. Pawloski, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 267 days.

(21) Appl. No.: 10/699,767

(22) Filed: Nov. 3, 2003

(51) Int. Cl.
*G01F 9/00* (2006.01)

(52) U.S. Cl. .......................................... 430/5

(58) Field of Classification Search .................... 430/5; 428/14; 355/75; 378/35; 361/226
See application file for complete search history.

(56) References Cited

U.S. PATENT DOCUMENTS 6,893,780 B1 * 5/2005 Galan et al. .................... 430/5

* cited by examiner

*Primary Examiner*—S. Rosasco
(74) *Attorney, Agent, or Firm*—Renner, Otto, Boisselle & Sklar, LLP

(57) ABSTRACT

An extreme ultraviolet (EUV) lithography mask blank. The mask blank can include a substrate having a reflector film disposed over an upper surface of the substrate. The mask blank is provided with structural features to facilitate indirect grounding of the reflector film.

20 Claims, 3 Drawing Sheets

EUV Energy Source 24

EXTREME ULTRAVIOLET (EUV) LITHOGRAPHY MASKS

TECHNICAL FIELD

The present invention relates generally to the field of integrated circuit manufacture and, more particularly, to masks that are particularly well-suited for use in an extreme ultraviolet (EUV) lithography system.

BACKGROUND

The formation of various integrated circuit (IC) structures on a wafer often relies on lithographic processes, sometimes referred to as photolithography. For instance, patterns can be formed from a photo resist (PR) layer by passing light energy through a mask (or reticle) having an arrangement to image the desired pattern onto the PR layer. As a result, the pattern is transferred to the PR layer. In areas where the PR is sufficiently exposed and after a development cycle, the PR material can become soluble such that it can be removed to selectively expose an underlying layer (e.g., a semiconductor layer, a metal or metal containing layer, a dielectric layer, etc.). Portions of the PR layer not exposed to a threshold amount of light energy will not be removed and serve to protect the underlying layer. The exposed portions of the underlying layer can then be etched (e.g., by using a chemical wet etch or a dry reactive ion etch (RIE)) such that the pattern formed from the PR layer is transferred to the underlying layer. Alternatively, the PR layer can be used to block dopant implantation into the protected portions of the underlying layer or to retard reaction of the protected portions of the underlying layer. Thereafter, the remaining portions of the PR layer can be stripped.

There is a pervasive trend in the art of IC fabrication to increase the density with which various structures are arranged. As a result, there is a corresponding need to increase the resolution capability of lithography systems. One promising alternative to conventional optical lithography is a next-generation lithography technique known as extreme ultraviolet (EUV) lithography where wavelengths in the range of about 11 nm to about 14 nm are used to expose the PR layer. For example, using a numerical aperture of about 0.25, a wavelength of about 13.4 nm and a $k_1$ value of about 0.6, it has been proposed that a resolution of about 32 nm can be achieved.

However, attempts to implement EUV lithography have encountered a number of challenges. With additional reference to FIG. 1, a conventional EUV lithography mask 10 is illustrated. The mask includes a glass substrate 12. A multilayer reflector film stack 14 is deposited on an upper surface of the substrate 12. The multilayer stack 14 can be made from alternating layers of high-Z and low-Z materials, such as molybdenum and silicon layers (Mo/Si), molybdenum carbon and silicon layers ($Mo_2C$/Si), molybdenum and beryllium layers (Mo/Be), or molybdenum ruthenium and beryllium layers (MoRu/Be). Together, the substrate 12 and multilayer stack 14 can form a mask blank. To function as an EUV lithography mask, absorbing material can be deposited and patterned on the multilayer stack 14 to form a plurality of absorbers 16. Although the absorbers 16 are illustrated as individual structures, the absorbers 16 can form an interconnected pattern. A buffer layer (not shown) can be formed between the multilayer stack 14 and the absorbing material 16 to facilitate etching of the absorbing material with minimal damage to the multilayer stack 14. Absorbers have been made from chromium (Cr), titanium nitride (TiN) and tantalum nitride (TaN). Alternatively, as shown in FIG. 2, a functional EUV lithography mask can be formed by patterning the multilayer stack 14 of the mask blank to form a plurality of individual or interconnected multilayer reflectors 14'. In this alternative arrangement, a conductive layer 18 can be present between the etched multilayer reflectors 14' and the substrate 12.

The EUV light used to expose the wafer generates photoelectrons, thereby causing the top of the mask 10 (e.g., the absorbers 16 and multilayer stack 14) to become electrically charged. This condition can result in particle attraction and/or electrostatic discharge (ESD) damage to the mask 10, both of which can lead to image pattern defects. Unfortunately, attempts to ground the absorbers 16 and/or multilayer stack 14 using direct mechanical contact will also lead to particle attraction and image pattern defects.

Accordingly, there exists a need in the art for improved EUV lithography masks and methods of grounding EUV lithography masks.

SUMMARY OF THE INVENTION

According to one aspect of the invention, the invention is directed to an extreme ultraviolet (EUV) lithography mask blank. The mask blank can include a substrate having an upper surface, a lower surface and a edge surface connecting the upper surface and the lower surface; and a reflector film disposed over the upper surface and at least a portion of the edge surface such that a region of the reflector film disposed on the edge surface is non-planar with an upper surface of a region of the reflector film disposed on the upper surface of the substrate.

According to another aspect of the invention, the invention is directed to an extreme ultraviolet (EUV) lithography mask blank. The mask blank can include a substrate having an upper surface and a lower surface; a reflector film disposed over the upper surface of the substrate; a backside conductive layer disposed on the lower surface of the substrate; and a means to electrically couple the conductive layer and the reflector film.

BRIEF DESCRIPTION OF DRAWINGS

These and further features of the present invention will be apparent with reference to the following description and drawings, wherein.

DISCLOSURE OF INVENTION

Figure 1:
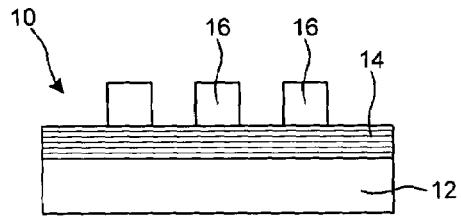
FIG. 1 is a schematic cross-section of one embodiment of a conventional extreme ultraviolet (EUV) lithography mask.
Figure 2:
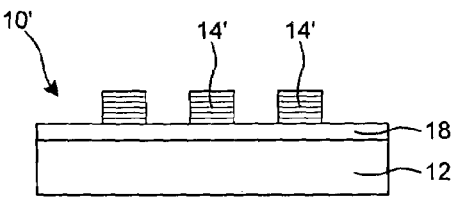
FIG. 2 is a schematic cross-section of another embodiment of a conventional EUV lithography mask.

In the detailed description that follows, some corresponding components have been given the same reference numerals, regardless of whether they are shown in different embodiments of the present invention. To illustrate the present invention in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

The description herein is presented in the exemplary context of fabricating a wafer having an integrated circuit (IC) formed thereon. Example ICs include general purpose microprocessors made from thousands or millions of transistors, a flash memory array or any other dedicated circuitry. However, one skilled in the art will appreciate that the methods and devices described herein can also be applied to the fabrication of any article manufactured using lithography, such as micromachines, disk drive heads, gene chips, micro electromechanical systems (MEMS) and so forth.

Figure 3:
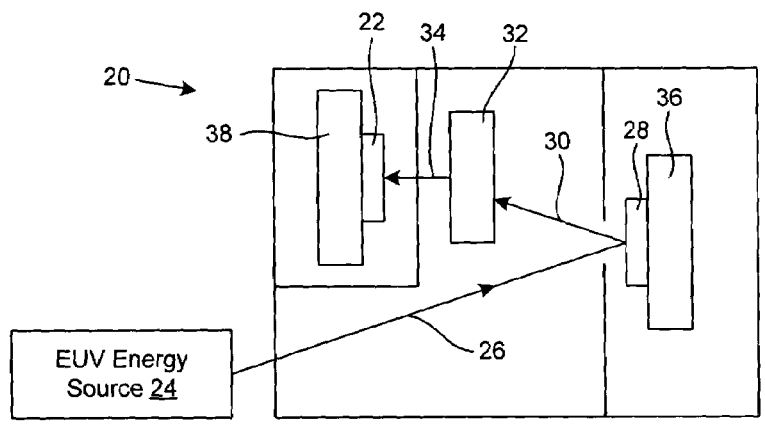
FIG. 3 is a schematic block diagram of a exemplary integrated circuit processing arrangement.

Referring initially to FIG. 3, illustrated is a schematic block diagram of an exemplary IC processing arrangement that includes an extreme ultraviolet (EUV) lithography system 20 used to image a pattern onto a wafer 22, or a region thereof. The general arrangement of the system 20 is relatively well known in the art and will not be described in great detail. The system 20 can include a EUV light source 24 for directing EUV energy 26 towards a mask 28 (sometimes referred to as a reticle). The EUV energy source 24 can include, for example, a high power laser that generates highly ionized atoms from matter onto which the laser is directed, thereby generating EUV energy 26, or by using a synchrotron. The EUV energy 26 can have a wavelength of about 11 nm to about 14 nm, and in one embodiment, the wavelength can be about 13.4 nm.

The mask 28 selectively absorbs and reflects EUV energy 26 such that an EUV energy pattern 30 defined by the mask 28 is transferred (e.g., reflected) towards the wafer 22. An imaging subsystem 32, such as a stepper assembly or a scanner assembly, sequentially directs the pattern 30 reflected by the mask 28 to a series of desired locations on the wafer 22 in the form of an exposure pattern 34.

The mask 28 can be retained by an electrostatic mask platen assembly 36 that includes an electrostatic chuck. Similarly, the wafer 22 can be retained by a wafer stage platen assembly 38. In one embodiment, the assemblies 36, 38 can be housed in separate chambers. The assembly 36 and mask 28 can be housed in a mask chamber that can be maintained at high or ultra-high vacuum (e.g., between about $10^{-5}$ torr and about $10^{-11}$ torr). The assembly 38 and wafer 22 can be housed in a wafer chamber that is maintained at high or ultra-high vacuum (e.g., between about $10^{-5}$ torr and about $10^{-11}$ torr). The chamber can include an aperture (not shown) through which the exposure pattern 34 passes. The remaining elements (e.g., the imaging subsystem 32) can be housed in one or more chambers that are kept, for example, in vacuum to minimize attenuation of the EUV radiation.

Figure 4:
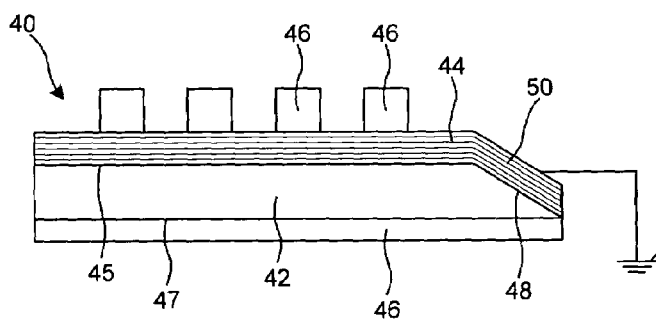
FIG. 4 is a schematic cross-section of an example embodiment of an EUV lithography mask.

Referring now to FIG. 4, shown is one embodiment of an EUV lithography mask 40. The mask 40 can be used as the mask 28 in the EUV lithography system 20. The mask 40 can include a glass substrate 42, such as quartz glass (e.g., $SiO_2$) or ultra-low expansion glass (e.g., glasses sold under the designation ULE™ or ZERODUR™). The substrate 42 can be about 1 mm to about 10 mm thick.

A multilayer reflector film stack 44 can be formed (e.g., by deposition) over or directly on an upper surface 45 of the substrate 42. The upper surface 45 can be generally planar. The reflector film 44 can be made from alternating layers of high-Z and low-Z materials, such as molybdenum and silicon layers (Mo/Si), molybdenum carbon and silicon layers ($Mo_2C$/Si), molybdenum and beryllium layers (Mo/Be), or molybdenum ruthenium and beryllium layers (MoRu/Be). In total, the reflector film 44 can include about 80 individual layers and can be about 200 nm to about 300 nm thick. In one embodiment, an additional interface layer (not shown) can be deposited on the substrate 42 before formation of the reflector film 44. The additional interface layer can be made from conductive material (e.g., silicon, molybdenum, chromium, ruthenium, indium tin oxide, titanium nitride or other suitable material) so as to electrically couple reflectors patterned from the reflector film 44.

A conductive layer 46 can be formed on a lower surface 47 (or backside) of the substrate 42. The lower surface 47 of the substrate 42 can be generally planar and parallel to the upper surface 45 of the substrate. The layer 46 can be made from an electrically conductive material such as chromium, silicon, indium tin oxide, titanium nitride or other suitable material. The layer 46 can be about 100 nm to about 10 microns thick. The conductive layer 46 allows the mask 40 to be electrostatically clamped to an electrostatic chuck of the exposure tool, or to chucks of other tools, including a registration metrology tool and a mask writer tool.

Together, the substrate 42, the reflector film 44 and the conductive layer 46 can form a mask blank. The functional EUV lithography mask 40 can be formed from the mask blank in at least two ways. For example, and as illustrated in FIG. 4, absorbing material can be deposited and patterned on the reflector film 44 to form a plurality of absorbers 46. Although the absorbers 46 are illustrated as individual structures, the absorbers 46 can form an interconnected pattern. A buffer layer (not shown) can be formed between the reflector film 44 and the absorbing material used to form the absorbers 46. The buffer layer can facilitate etching of the absorbing material with minimal damage to the reflector film 44. The absorbers can be made from chromium (Cr), titanium nitride (TiN) or tantalum nitride (TaN). Alternatively, the functional EUV lithography mask 40 can be formed by patterning the reflector film 44. In this alternative, a conductive layer can be present between the etched film 44 and the substrate 42. The pattern of the absorbers 46 and/or the reflector film 44 defines the EUV energy pattern 30 reflected by the mask 40.

As indicated, the EUV energy 26 directed towards the mask 40 can generate photoelectrons, thereby causing the layers disposed on the upper surface 45 of the substrate 42 (e.g., the absorbers 46 and reflector film 44, or front side layers) to become electrically charged. This condition can result in particle attraction and/or electrostatic discharge (ESD) damage to the mask 40, both of which can lead to image pattern defects.

To address these issues, the mask 40 includes structural features to allow the absorbers 46 and/or reflector film 44 to be indirectly grounded. The indirect grounding of these portions of the mask 40 removes charge from the mask 40 to avoid particle attraction and ESD damage to the mask 40. Indirect grounding, as used herein, refers to an arrangement where the portion(s) of the reflector film and/or absorbers used in creating the EUV energy pattern 30 is electrically coupled to a ground potential (or other desired voltage potential) without direct mechanical connection by a probe or other means to an exposed surface of the EUV energy pattern 30 generating areas of the reflector film and/or absorbers.

In the example of FIG. 4, the substrate 42 of the mask includes a tapered, or beveled edge 48 (e.g., such that the upper surface 45, the lower surface 47, and side edges of the substrate, when taken in cross-section, define a trapezoid). The beveled edge 48 defines an edge surface and can be formed by mechanical methods (e.g., by grinding the substrate 42) and/or by chemical methods (e.g., wet or dry reactive etching). In one embodiment, the beveled edge 48 is planar and forms complimentary angles with respect to the upper and lower surfaces of the substrate 42. In one example, the beveled edge 48 can be disposed at an angle of about 10 degrees to about 80 degrees with respect to the lower surface 47 of the substrate 42. In other embodiments, the beveled edge 48 can be non-planar, can be defined by multiple planes, can form non-complimentary angles with the upper and lower surfaces of the substrate, can be non-continuous with respect to the entire length of a side edge of the substrate 42, can be formed only along a portion of a side edge of the substrate 42, can be formed along more than one side edge of the substrate and/or can have a non-uniform surface (e.g., rougher than the upper surface 45 of the substrate 42).

The reflector film 44 can be formed on the substrate 42 such that the reflector film 44 conforms to the upper surface 45 of the substrate 42 and the beveled edge 48. In this manner, the reflector film 44 includes a region 50 that is non-planar with the portion of the reflector film 44 disposed on the upper surface 45 of the substrate 42. If present, a conductive layer disposed between the reflector film 44 and the substrate can also conform to the beveled edge and such conforming portion can serve as, or as part of, the region 50.

The region 50 can be connected to a ground potential 52. In one example, connection to the ground potential 52 can be established using a mechanical means, such as probe. As used herein, the term ground potential includes any other positive or negative voltage potential that may be desired. By the establishment of a ground connection to the mask 40 in this manner, charge build up on the reflector film 44 and/or absorbers 46 can be avoided. Therefore, particles will not have a tendency to become attracted to and land on the reflector film 44 and/or absorbers 46. In addition, charge will have a path to dissipate from the mask 40, thereby minimizing or avoiding the occurrence of ESD damage to the mask.

The conductive layer 46 and the region 50 of the reflector film 44 may make physical and/or electrical contact, such as in the form of a line contact along the intersection of the beveled edge 48 and the lower surface 47 of the substrate 42. However, depending on the geometry of the substrate 42, the order of layer formation and how the layers are deposited, grown or otherwise formed, larger areas of the conductive layer 46 and the reflector film 44 may make physical and/or electrical contact. Accordingly, the conductive layer 46 can be connected to the ground potential 52 through the reflector film 44.

Alternatively, the conductive layer 46 can be coupled to the ground potential 52 and the reflector film 44 can be connected to the ground potential 52 through the conductive layer 46.

Figure 5:
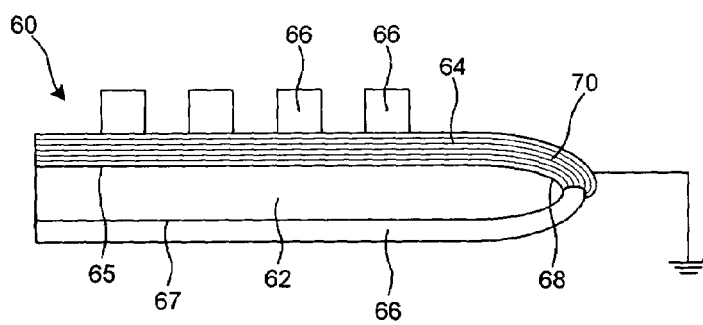
FIG. 5 is a schematic cross-section of another example embodiment of an EUV lithography mask.

Referring now to FIG. 5, shown is another embodiment of an EUV lithography mask 60. As will be appreciated, the mask 60 can share a number of similar features to the mask 40, such as materials used, thickness of layers and so forth.

The mask 60 can be used as the mask 28 in the EUV lithography system 20. The mask 60 can include a glass substrate 62, such as quartz glass (e.g., $SiO_2$) or ultra-low expansion glass (e.g., glasses sold under the designation ULE or ZERODUR). The substrate 42 can be about 1 mm to about 10 mm thick.

A multilayer reflector film stack 64 can be formed (e.g., by deposition) over or directly on an upper surface 65 (or front side) of the substrate 62. The upper surface 65 can be generally planar. The reflector film 64 can be made from alternating layers of high-Z and low-Z materials, such as molybdenum and silicon layers (Mo/Si), molybdenum carbon and silicon layers ($Mo_2C$/Si), molybdenum and beryllium layers (Mo/Be), or molybdenum ruthenium and beryllium layers (MoRu/Be). In total, the reflector film 64 can include about 80 individual layers and can be about 200 nm to about 300 nm thick. In one embodiment, an additional interface layer (not shown) can be deposited on the substrate 42 before formation of the reflector film 44. The additional interface layer can be made from conductive material (e.g., silicon, molybdenum, chromium, ruthenium, indium tin oxide, titanium nitride or other suitable material) so as to electrically couple reflectors patterned from the reflector film 44.

A conductive layer 66 can be formed on a lower surface 67 (or backside) of the substrate 62. The lower surface 67 of the substrate 62 can be generally planar and parallel to the upper surface 65 of the substrate 62. The layer 66 can be made from an electrically conductive material such as chromium, silicon, indium tin oxide, titanium nitride or other suitable material. The layer 66 can be about 100 nm to about 10 microns thick. The conductive layer 66 allows the mask 60 to be electrostatically clamped to an electrostatic chuck of the exposure tool, or to chucks of other tools, including a registration metrology tool and a mask writer tool.

Together, the substrate 62, the reflector film 64 and the conductive layer 66 can form a mask blank. The functional EUV lithography mask 60 can be formed from the mask blank in at least two ways. For example, and as illustrated in FIG. 5, absorbing material can be deposited and patterned on the reflector film 64 to form a plurality of absorbers 66. Although the absorbers 66 are illustrated as individual structures, the absorbers 66 can form an interconnected pattern. A buffer layer (not shown) can be formed between the reflector film 64 and the absorbing material used to form the absorbers 66. The buffer layer can facilitate etching of the absorbing material with minimal damage to the reflector film 64. The absorbers can be made from chromium (Cr), titanium nitride (TiN) and tantalum nitride (TaN). Alternatively, the functional EUV lithography mask 60 can be formed by patterning the reflector film 64. In this alternative, a conductive layer can be present between the etched film 64 and the substrate 62. The pattern of the absorbers 66 and/or the reflector film 64 defines the EUV energy pattern 30 reflected by the mask 60.

As indicated, the EUV energy 26 directed towards the mask 60 can generate photoelectrons, thereby causing the layers disposed on the upper surface 65 of the substrate 62 (e.g., the absorbers 66 and reflector film 64, or front side layers) to become electrically charged. This condition can result in particle attraction and/or electrostatic discharge (ESD) damage to the mask 60, both of which can lead to image pattern defects.

To address these issues, the mask 60 includes structural features to allow the absorbers 66 and/or reflector film 64 to be indirectly grounded. The indirect grounding of these portions of the mask 60 removes charge from the mask 60 to avoid particle attraction and ESD damage to the mask 60.

In the example of FIG. 5, the substrate 62 of the mask includes a curved edge 68 that defines an edge surface. In one embodiment, the curved edge 68 includes an arcuate portion that curves from the upper surface 65 of the substrate 62 towards the lower surface 67 of the substrate 62. As illustrated, the curved edge 68 can include another arcuate portion that curves from the lower surface 67 of the substrate 62 towards the upper surface 65 of the substrate 62. It should be appreciated that one of the arcuate portions can be omitted. The arcuate portions can meet at a cusp or, as illustrated, in a smooth transition, such as a radiussed side edge of the substrate 62 (e.g., a side edge defining an elliptical segment). In one embodiment, the arcuate portions can be mirror images of one another. Alternatively, the arcuate portions can be defined by different linear or curvilinear geometries. The arcuate portions can be defined by constant radius paths or, as shown, by non-constant radius paths (including paths defined by second, third and higher order equations). In another embodiment, one or both of the arcuate portions are not arcuate at all, but define a linear path (e.g., both portions can be linear to form a triangle shaped side edge portion of the substrate 62).

The curved edge 68 can be formed by mechanical methods (e.g., by grinding the substrate 62) and/or by chemical methods (e.g., wet or dry reactive etching).

The reflector film 64 can be formed on the substrate 42 such that the reflector film 64 conforms to the upper surface 65 of the substrate 42 and the curved edge 68. In this manner, the reflector film 64 includes a region 70 that is non-planar with the portion of the reflector film 64 disposed on the upper surface 65 of the substrate 62. The region 70 can conform to a portion of the curved edge 68 (e.g., through about ninety degrees from the upper surface 65 of the substrate 62 towards the lower surface 67 of the substrate 62 as illustrated) or conform to the majority of the curved edge 68 (e.g., from the upper surface 65 of the substrate 62 to the lower surface 67 of the substrate 62). If present, a conductive layer disposed between the reflector film 64 and the substrate can also conform to the curved edge and such conforming portion can serve as, or as part of, the region 70.

The region 70 can be connected to a ground potential 72. In one example, connection to the ground potential 72 can be established using mechanical means, such as a probe. As used herein, the term ground potential includes any other positive or negative voltage potential that may be desired. By the establishment of a ground connection to the mask 60 in this manner, charge build up on the reflector film 64 and/or absorbers 66 can be avoided. Therefore, particles will not have a tendency to become attracted to and land on the reflector film 64 and/or absorbers 66. In addition, charge will have a path to dissipate from the mask 60, thereby minimizing or avoiding the occurrence of ESD damage to the mask.

The conductive layer 66 can be formed on the substrate 62 such that the conductive layer 66 conforms to the lower surface 67 of the substrate 62 and at least a portion of the curved edge 68. In one embodiment, the conductive layer 66 and the region 70 of the reflector film 64 make physical and/or electrical contact. In one embodiment, the conductive layer 66 is formed prior to the reflector film 64 such that the reflector film 64 at least partially conforms to the conductive layer 66 in addition to the substrate 62. Accordingly, the conductive layer 66 can be connected to the ground potential 72 through the reflector film 64. Alternatively, the conductive layer 66 can be coupled to the ground potential 72 and the reflector film 64 can be connected to the ground potential 72 through the conductive layer 66.

Figure 6:
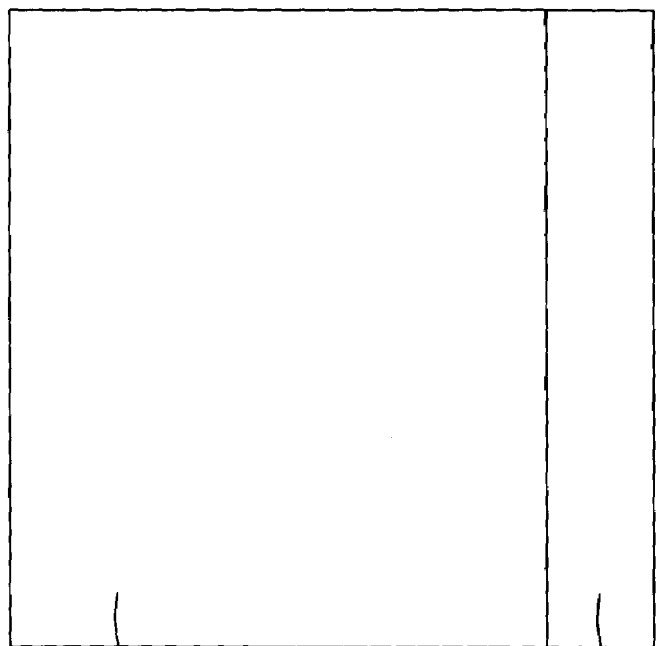
FIG. 6 is a top view of an example embodiment of a substrate for an EUV lithography mask.
Figure 7:
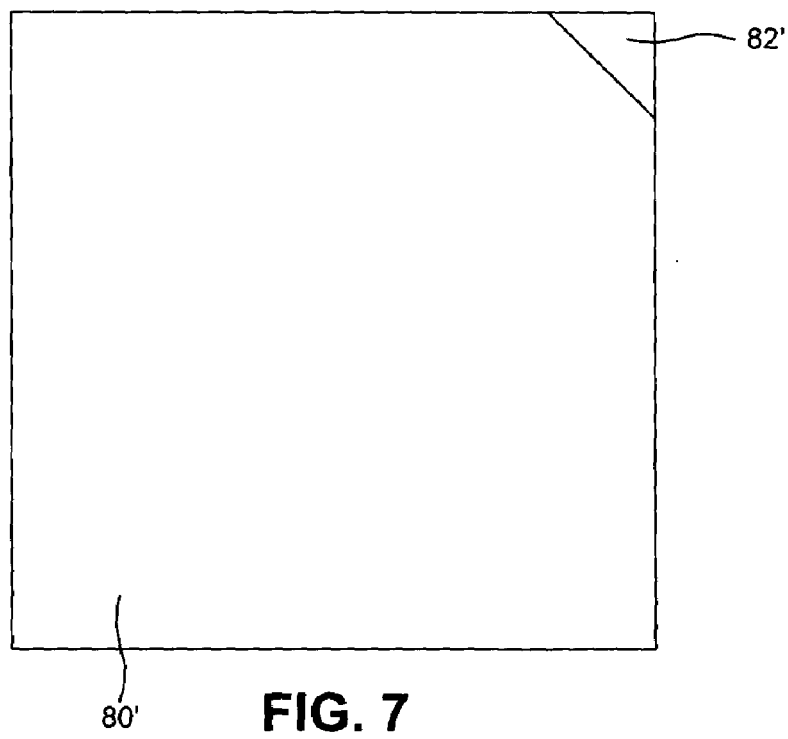
FIG. 7 is a top view of another example embodiment of a substrate for an EUV lithography mask.

With additional reference to FIGS. 6 and 7, illustrated are example top views of substrates 80 and 80' that could be used to form the mask 40 (FIG. 4) or the mask 60 (FIG. 5). In general, the substrate 80 (FIG. 6) defines a rectangular parallelepiped except for at least a portion of at least one side edge that has been modified to form a shaped edge portion 82. To form the mask 40, the shaped edge portion 82 can define the beveled edge 48 (e.g., the substrate 80, or at least a portion thereof, defines a right prism). To form the mask 60, the shaped edge portion 82 can define the curved edge 68.

In general, the substrate 80' (FIG. 7) defines a rectangular parallelepiped except for at least a portion of at least one corner that has been modified to form a shaped corner portion 82'. As used herein, the term edge surface include shaped edge portions 82 and shaped corner portions 82'. To form the mask 40, the shaped corner portion 82' can define the beveled edge 48 (e.g., the shaped corner portion 82' taken alone in isolation from the rest of the substrate 80 would form a tetrahedron). To form the mask 60, the shaped corner portion 82' can define the curved edge 68.

Shaping of a rectangular parallelepiped substrate blank to form the substrate 80 or substrate 80' can be carried out prior to reflector film deposition. Therefore, in most cases, impacts or changes to the formation of the reflector film (such as by conventional multilayer deposition techniques) can be minimized.

Figure 8:
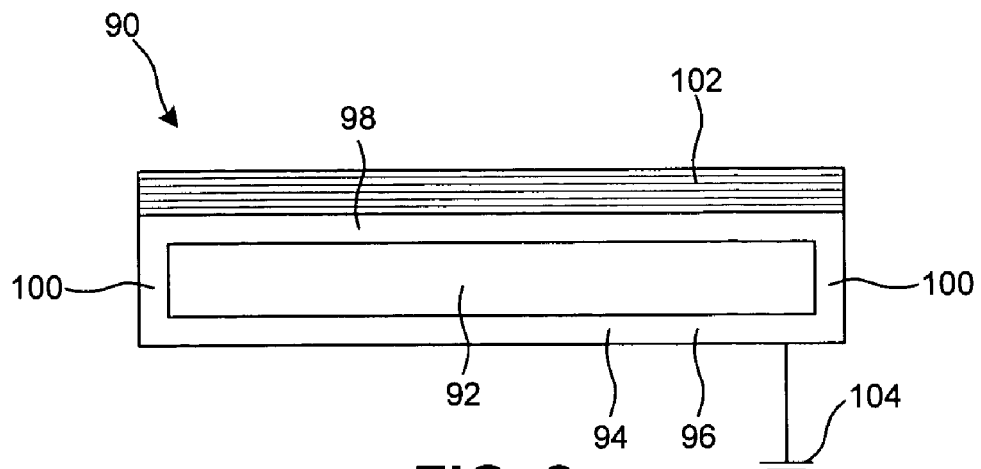
FIG. 8 is a schematic cross-section of another example embodiment of an EUV lithography mask.

Referring now to FIG. 8, shown is an example embodiment of an EUV lithography mask blank 90 that can be used to form a functional EUV lithography mask that, in turn, can be used as the mask 28 (FIG. 3). The mask blank 90 includes a substrate 92 that is at least partially encapsulated in a conductive layer 94. In one embodiment, the conductive layer 94 includes a segment disposed on a lower surface (or backside) of the substrate 92 (referred to herein as a bottom segment 96), a segment disposed on an upper surface (or front side) of the substrate 92 (referred to herein as a top segment 98) and a segment disposed on at least one side edge of the substrate 92 (referred to herein as a side segment 100). These segments 96, 98, 100 of the conductive layer 94 are physically and/or electrically interconnected to provide electrical conduction from the top of the mask blank 90 to the bottom of the mask blank 90.

A multilayer reflector film stack 102 can be disposed on an upper surface of the top segment 98 of the conductive layer 94. To form a functional EUV mask from the mask blank, absorbers can be added over the reflector film 102 and/or the reflector film 102 can be patterned.

The mask formed from the mask blank 90 can be coupled to a ground potential 104 by connection the conductive layer 94 (such as the bottom segment 96 and/or the side segment 100) to the ground potential 104. The connection can be made using a probe or other mechanical means. In this manner, indirect grounding of the reflector film 102 and any absorbers disposed thereon can be achieved. In the illustrated embodiment, the reflector film 102 is disposed on or is in electrical contact with a ground plane established by the top segment 98 of the conductive layer 94 and electrical connection to the ground potential 104 is established through other segments of the conductive layer (e.g., the side segment 100 and/or the bottom segment 96).

This indirect grounding of the reflector film 102 and/or the absorbers disposed thereon (not shown) can serve to remove charge from a mask made from the mask blank 90 to avoid particle attraction and ESD damage to the mask during use in an EUV lithography system (e.g., the system 20 of FIG. 3). The mechanical contact to the backside of the mask can avoid or minimize particle attraction to the front side region of the mask.

Similar to the embodiments of FIGS. 4 and 5, the substrate 92 can be made from glass and the conductive layer 94 can be made from electrically conductive material, such as chromium, silicon, indium tin oxide, titanium nitride, etc. The reflector film 44 can be made from alternating layers of high-Z and low-Z materials. The thicknesses and compositions of these layers, can be the same or similar to those identified for the masks 40 and/or 60. The top segment 98 of the conductive layer 94 can be about 100 nm thick to about 10 nm thick.

Figure 9:
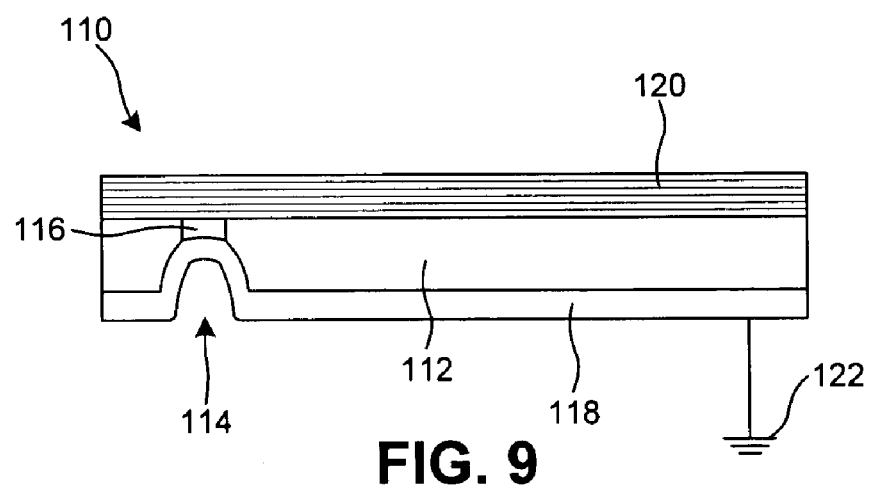
FIG. 9 is a schematic cross-section of yet another example embodiment of an EUV lithography mask.

Referring now to FIG. 9, shown is an example embodiment of an EUV lithography mask blank 110 that can be used to form a functional EUV lithography mask that, in turn, can be used as the mask 28 (FIG. 3). The mask blank 110 includes a substrate 112, such as a glass substrate. The lower surface (or backside) of the substrate 112 can include a recess 114, such as a notch or half-blind hole. In the area of the recess 114, the thickness of the substrate 112 is reduced relative to the non-recessed portions of the substrate 112. In one embodiment, the substrate 112 is about 1 mm to about 10 mm thick. The recess 114 can reduce the thickness of the substrate by about 20 percent to about 80 percent to leave a thinned substrate portion 116 that is about 0.2 mm to about 8 mm thick.

The substrate 112, or at least the area of the substrate 112 defining the recess 114, can be implanted or impregnated with ions, molecules or compounds to locally increase the conductivity of the substrate 112. For example, the thinned portion 116 can be implanted with ions such as indium, phosphorous, gallium, boron or arsenic, to name a few. The thinned portion 116 can be located adjacent the periphery of the substrate 112 or in another strategically selected location to avoid introducing distortions in the EUV pattern 30 reflected by a mask formed from the mask blank 110.

The mask blank 110 can also include a conductive layer 118 disposed on the lower surface of the substrate 112. The conductive layer 118 can be made from, for example, chromium, silicon or titanium nitride. The conductive layer 118 can conform to the recess 114 such that the thinned portion 116 is in electrical connection with the conductive layer 118.

A multilayer reflector film stack 120 can be disposed on an upper surface (or front side) of the substrate 112. The reflector film 120 can be in electrical connection with the thinned portion 116. To form a functional EUV mask from the mask blank 110, absorbers can be added over the reflector film 120 and/or the reflector film 120 can be patterned. If desired, a conductive layer can be present between the reflector film 120 and the substrate 112.

The mask formed from the mask blank 110 can be coupled to a ground potential 122 by connecting the conductive layer 118 to the ground potential 122.

The connection can be made using a probe or other mechanical means. In this manner, indirect grounding of the reflector film 120 and any absorbers disposed thereon can be achieved by the establishment of a conductive path from the reflector film 120 to the ground potential 122 through the thinned portion 116 and the conductive layer 118.

This indirect grounding of the reflector film 120 and/or the absorbers disposed thereon (not shown) can serve to remove charge from a mask made from the mask blank 110 to avoid particle attraction and ESD damage to the mask during use in an EUV lithography system (e.g., the system 20 of FIG. 3).

Similar to the embodiments of FIGS. 4 and 5, the substrate 110 can be made from glass and the conductive layer 118 can be made from chromium, silicon, indium tin oxide, titanium nitride or other suitable material. The reflector film 120 can be made from alternating layers of high-Z and low-Z materials. Other than the thinned portion 116, the thicknesses and compositions of these layers can be the same or similar to those identified for the masks 40 and/or 60.

Figure 10:
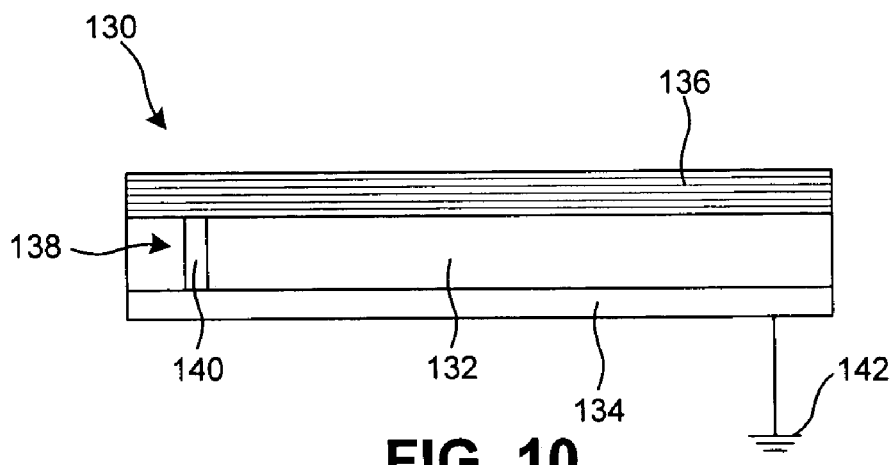
FIG. 10 is a schematic cross-section of still another example embodiment of an EUV lithography mask.

Referring now to FIG. 10, shown is an example embodiment of an EUV lithography mask blank 130 that can be used to form a functional EUV lithography mask that, in turn, can be used as the mask 28 (FIG. 3). The mask blank 130 includes a substrate 132, such as a glass substrate. The mask blank 130 can also include a conductive layer 134 disposed on a lower surface (or backside) of the substrate 132. The conductive layer 134 can be made from, for example, chromium, silicon, indium tin oxide, titanium nitride or other suitable material. A multilayer reflector film stack 136 can be disposed on an upper surface (or front side) of the substrate 132.

The substrate 132 can include a through hole 138. In one embodiment, the hole 138 has a diameter of about 1 micron to about 2 mm, but the hole need not be round when viewed from above. The hole 138 can be filled with a conductive material, such as a metal, metal containing compound, doped semiconductor and so forth, thereby forming a conductive plug 140 disposed within the hole 138 that is defined by the substrate 132. In one embodiment, the conductive plug 140 is formed from the same material as the conductive layer 134. In this embodiment, the conductive plug 140 can be formed at the same time as conductive layer 134 formation. In other embodiments, the conductive plug 140 is formed at a different time and/or from a different material than the conductive layer 134. In one embodiment, the hole 138 is not completely filled. For example, the sidewalls of the substrate defining the hole can be coated or partially coated. Therefore, the conductive plug need not be a solid member.

The conductive plug 140 can be in physical and/or electrical contact with the reflector film 136 and the conductive layer 134. The hole 138 (and conductive plug 140) can be located adjacent the periphery of the substrate 132 or in another strategically selected location to avoid introducing distortions in the EUV pattern 30 reflected by a mask formed from the mask blank 130.

To form a functional EUV mask from the mask blank 130, absorbers can be added over the reflector film 136 and/or the reflector film 136 can be patterned. If desired, a conductive layer can be present between the reflector film 136 and the substrate 132.

The mask formed from the mask blank 130 can be coupled to a ground potential 142 by connecting the conductive layer 134 to the ground potential 142. The connection can be made using a probe or other mechanical means. In this manner, indirect grounding of the reflector film 134 and any absorbers disposed thereon can be achieved by the establishment of a conductive path from the reflector film 134 to the ground potential 142 through the conductive plug 140 and the conductive layer 134.

This indirect grounding of the reflector film 136 and/or the absorbers disposed thereon (not shown) can serve to remove charge from a mask made from the mask blank 130 to avoid particle attraction and ESD damage to the mask during use in an EUV lithography system (e.g., the system 20 of FIG. 3).

Similar to the embodiments of FIGS. 4 and 5, the substrate 132 can be made from glass and the conductive layer 134 can be made from chromium, silicon, indium tin oxide, titanium nitride, etc. The reflector film 136 can be made from alternating layers of high-Z and low-Z materials. The thicknesses and compositions of these layers can be the same or similar to those identified for the masks 40 and/or 60.

Although particular embodiments of the invention have been described in detail, it is understood that the invention is not limited correspondingly in scope, but includes all changes, modifications and equivalents coming within the spirit and terms of the claims appended hereto.

What is claimed is:

1. An extreme ultraviolet (EUV) lithography mask blank, comprising:
    a substrate having an upper surface, a lower surface and a edge surface connecting the upper surface and the lower surface; and
    a reflector film disposed over the upper surface and at least a portion of the edge surface such that a region of the reflector film disposed on the edge surface is non-planar with an upper surface of a region of the reflector film disposed on the upper surface of the substrate.

2. The EUV lithography mask blank according to claim 1, wherein the region of the reflector film disposed on the edge surface is adapted to receive a mechanical ground connection.

3. The EUV lithography mask blank according to claim 1, further comprising a conductive layer disposed on the lower surface of the substrate.

4. The EUV lithography mask blank according to claim 3, wherein the reflector film and the conductive layer contact each other adjacent the edge surface.

5. The EUV lithography mask blank according to claim 4, wherein the conductive layer is adapted to receive a mechanical ground connection.

6. The EUV lithography mask blank according to claim 3, wherein the region of the reflector film disposed on the edge surface is adapted to receive a mechanical ground connection.

7. The EUV lithography mask blank according to claim 1, wherein the reflector film includes a plurality of alternative high-Z and low-Z layers.

8. The EUV lithography mask blank according to claim 1, wherein the region of the reflector film disposed on the edge surface and the region of the reflector film disposed on the upper surface of the substrate are integrally formed during the same process operation.

9. The EUV lithography mask blank according to claim 1, further comprising a plurality of absorbers disposed over the region of the reflector film disposed over the upper surface of the substrate, the absorbers having a pattern to generate an EUV energy pattern when EUV energy is directed towards the mask blank.

10. The EUV lithography mask blank according to claim 1, wherein the region of the reflector film disposed over the upper surface of the substrate is patterned to generate an EUV energy pattern when EUV energy is directed towards the mask blank.

11. The EUV lithography mask blank according to claim 1, wherein the edge surface is planar and angled so as to form complementary angles with the upper surface and the lower surface of the substrate.

12. The EUV lithography mask blank according to claim 1, wherein the edge surface is curved.

13. An extreme ultraviolet (EUV) lithography mask blank, comprising:
    a substrate having an upper surface and a lower surface;
    a reflector film disposed over the upper surface of the substrate;
    a backside conductive layer disposed on the lower surface of the substrate; and
    a means to electrically couple the conductive layer and the reflector film.

14. The EUV lithography mask blank according to claim 13, wherein the coupling means includes a front side conductive layer disposed between the reflector film and the substrate, the front side conductive layer and the backside conductive layer being electrically connected.

15. The EUV lithography mask blank according to claim 14, wherein the front side conductive layer functions as a ground plane for the reflector film when the backside conductive layer is mechanically connected to a ground potential.

16. The EUV lithography mask blank according to claim 13, wherein the coupling means includes a section of the substrate that has been impregnated to establish a conductive path from the backside conductive layer to the reflector film through the impregnated section of the substrate.

17. The EUV lithography mask blank according to claim 16, wherein the impregnated section of the substrate has a thickness that this less than a thickness of a region of the substrate designated for the transmission of patterned EUV energy.

18. The EUV lithography mask blank according to claim 13, wherein the coupling means include a conductive plug disposed in a hole defined by the substrate such that the conductive plug establishes a conductive path from the backside conductive layer to the reflector film.

19. The EUV lithography mask blank according to claim 13, wherein the conductive layer is adapted to receive a mechanical ground connection.

20. The EUV lithography mask blank according to claim 13, further comprising a plurality of absorbers disposed over the reflector film, the absorbers having a pattern to generate an EUV energy pattern when EUV energy is directed towards the mask blank.

* * * * *